(12) United States Patent
Ludwig

(10) Patent No.: US 8,581,116 B2
(45) Date of Patent: Nov. 12, 2013

(54) COMPONENT CARRIER

(75) Inventor: Matthias Ludwig, Moessingen (DE)

(73) Assignee: Robert Bosch GmbH, Stuttgart (DE)

( * ) Notice: Subject to any disclaimer, the term of this patent is extended or adjusted under 35 U.S.C. 154(b) by 163 days.

(21) Appl. No.: 13/265,472

(22) PCT Filed: Sep. 27, 2010

(86) PCT No.: PCT/EP2010/064259
§ 371 (c)(1),
(2), (4) Date: Oct. 20, 2011

(87) PCT Pub. No.: WO2011/045173
PCT Pub. Date: Apr. 21, 2011

(65) Prior Publication Data
US 2012/0036707 A1 Feb. 16, 2012

(30) Foreign Application Priority Data
Oct. 15, 2009 (DE) .......................... 10 2009 045 722

(51) Int. Cl.
*H02B 1/40* (2006.01)
*H05K 7/02* (2006.01)

(52) U.S. Cl.
USPC .... 174/480; 174/541; 174/138 G; 248/221.11

(58) Field of Classification Search
USPC ............. 174/541, 542, 480, 503, 504, 138 G; 248/221.11, 221.14
See application file for complete search history.

(56) References Cited

U.S. PATENT DOCUMENTS

| 4,845,913 | A | * | 7/1989 | Bell | ................................ 52/699 |
| 5,950,973 | A | | 9/1999 | Verma | |
| 6,377,445 | B1 | * | 4/2002 | Davis et al. | .................... 361/752 |
| 6,445,588 | B1 | * | 9/2002 | Masterton et al. | ............ 361/759 |
| 6,654,255 | B2 | * | 11/2003 | Kruse et al. | .................... 361/799 |
| 7,151,677 | B2 | * | 12/2006 | Le et al. | ........................ 361/807 |
| 7,161,087 | B2 | * | 1/2007 | Hunkeler et al. | ......... 174/153 G |
| 7,589,277 | B2 | * | 9/2009 | Kessler et al. | ................... 174/50 |
| 7,727,030 | B2 | | 6/2010 | Christoph et al. | |
| 7,842,884 | B2 | * | 11/2010 | Johnson | ......................... 174/58 |

(Continued)

FOREIGN PATENT DOCUMENTS

| DE | 102004050674 | 4/2006 |
| DE | 102006023471 | 4/2006 |

(Continued)

OTHER PUBLICATIONS

International Search Report, PCT International Application No. PCT/EP2010/064259, dated Feb. 15, 2011.

*Primary Examiner* — Hung Ngo
(74) *Attorney, Agent, or Firm* — Kenyon & Kenyon LLP

(57) ABSTRACT

A component carrier is described for fastening a component on a mounting wall having a through-opening, including a receptacle device for the component, an installation device for establishing a fixation of the component carrier on the mounting wall, and a retaining device for the pre-fixation of the component carrier in the through-opening. The retaining device includes a pin structure and a rib structure extending along the pin structure, the pin structure and rib structure forming a fixation area, using which the retaining device is fixable in the through-opening. Furthermore, the retaining device includes a securing structure situated on the free end of the pin structure opposite to the rib structure, which prevents the retaining device from being pulled out of the through-opening.

13 Claims, 13 Drawing Sheets

(56) References Cited

U.S. PATENT DOCUMENTS

| | | | |
|---|---|---|---|
| 7,888,609 B2* | 2/2011 | Bakst et al. | 174/542 |
| 7,897,883 B2* | 3/2011 | Yang | 174/535 |
| 7,973,250 B2* | 7/2011 | Groeller et al. | 174/481 |
| 8,309,849 B2* | 11/2012 | Dinh | 174/58 |
| 2009/0300893 A1 | 12/2009 | Herrmann et al. | |
| 2011/0147074 A1* | 6/2011 | Cheng et al. | 174/480 |

FOREIGN PATENT DOCUMENTS

| | | |
|---|---|---|
| DE | 102006027750 | 12/2007 |
| DE | 102006027751 | 12/2007 |
| EP | 2014520 | 1/2009 |
| JP | 55-50036 | 9/1953 |
| JP | 56-152085 | 4/1955 |
| JP | 60-72565 | 5/1985 |
| JP | 61-187755 | 11/1986 |

* cited by examiner

COMPONENT CARRIER

FIELD OF THE INVENTION

The present invention relates to a component carrier for a component, in particular a vehicle acceleration sensor, with the aid of which the component is fastened on a mounting wall having a through-opening. To simplify one-handed installation, a pre-fixation of the component carrier on the mounting surface which is simple to establish and simple to detach is provided. For this purpose, a retaining device of the component carrier is inserted into the through-opening using a rotational movement in such a way that the component carrier is held in the achieved installation position because of its own weight. Furthermore, the present invention relates to a mounting module including the component carrier and the component situated therein as well as a fastening system having a component carrier fastened on the mounting wall.

BACKGROUND INFORMATION

Vehicle sensors, such as acceleration sensors of an airbag system used for crash recognition, are typically installed in vehicles in the form of a mounting module. This is a special component carrier in which the actual sensor is housed. The component carrier is in turn installed on a mounting surface of the vehicle via fasteners. A screw connection is frequently used as the fastener. In order to allow one-handed installation of the mounting module, the component carrier is typically pre-installed on the mounting wall. Through the pre-fixation, which is typically performed by clipping the sensor into a through-opening of the mounting wall, the installation position of the sensor is secured. This is typically performed with the aid of special pre-installation clips, which are inserted inside the through-opening and anchored via catch elements. The manufacture of such clips, which is typically performed with the aid of the injection molding process, has proven to be relatively complex, inter alia, because of the filigree catch elements.

SUMMARY

It is an object of the present invention to provide a component carrier having a retaining device, which allows simple pre-installation, on the one hand, and is simple to manufacture, on the other hand.

According to an example embodiment of the present invention, the component carrier for fastening a component on a mounting wall having a through-opening includes a receptacle device for the component, an installation device for establishing a fixation of the component carrier on the mounting wall, and a retaining device for the pre-fixation of the component carrier in the through-opening. The retaining device itself includes a pin structure and a rib structure extending along the pin structure. The pin structure and the rib structure form a fixation area, using which the retaining device is fixable in the through-opening. Furthermore, the retaining device includes a securing structure situated on the free end of the pin structure opposite to the rib structure, which prevents the retaining device from being pulled out or falling out of the through-opening unintentionally. The retaining device allows a fixation of the component carrier on the mounting wall which is particularly simple to establish, in which the component carrier is retained in a predefined installation position. The securing structure prevents the retaining device from unintentionally falling out of the through-opening. The simple design of the retaining device allows simple and cost-effective manufacture of the component carrier using the injection molding process.

In a first specific embodiment, it is provided that the retaining device is situated generally above the center of gravity of the component carrier. In this way, the component carrier is securely retained in the pre-installation position by its own weight.

In a further specific embodiment, it is provided that the pin structure and the rib structure jointly form a fixation area, using which the retaining device is fixable inside the through-opening. The diameter of the fixation area is selected in such a way that the retaining device is fixable in the through-opening with the aid of a transition fitting. Through this special fitting of the diameter in the fixation area and the through-opening, it is ensured that the retaining device is easily introducible into the through-opening. Simultaneously, in this way the retaining device is fixed between the side walls of the through-opening and a predefined installation position is thus achieved.

A further specific embodiment provides that the securing element is designed as a lug extending generally perpendicularly to the insertion direction. This simple design makes it easier to manufacture the retaining device and simultaneously ensures a sufficient securing function.

According to a further specific embodiment, the installation device is designed as a hole for the passage of a fastener. In this way, particularly simple installation using a screw connection is made possible.

In a further specific embodiment, it is provided that the rib structure has a rounding on its free end. This rounding allows the rib structure to slide on the side wall of the through-opening during the insertion procedure of the retaining device into the through-opening. The installation of the component carrier on the mounting wall is thus made easier.

A further specific embodiment provides that the rib structure is designed as a safeguard against incorrect installation of the retaining device in a through-opening having a slotted expansion, the position of the rib structure along the circumference of the pin structure being selected in accordance with the position of the slotted expansion along the circumference of the through-opening. Simple securing against incorrect installation of the component carrier on the mounting wall is thus achieved. Furthermore, coding may be implemented in this way, which prevents the installation of an incorrect component from a group of similar components.

In a further specific embodiment, it is provided that the rib structure is set back in relation to the securing structure along the pin structure. In this way, it is possible to transfer the retaining device into the predefined installation position by a tilting movement around an axis orthogonal to the insertion direction.

A further specific embodiment provides that the profile of the pin structure has a rounding in the fixation area, which allows a rotational movement of the retaining device located in the through-opening around an axis oriented in the insertion direction. The rounding further prevents the retaining device from jamming in the through-opening during the installation.

Furthermore, a mounting module is provided according to the present invention, which includes a component carrier as well as a component situated in the receptacle device of the component carrier, the component being designed as an acceleration sensor. Acceleration sensors are typically installed at positions in the vehicle which are difficult to access. Therefore, the example component carrier designed according to the present invention is particularly well suited for use with such an acceleration sensor.

BRIEF DESCRIPTION OF THE DRAWINGS

The present invention is explained in greater detail below on the basis of the figures.

DETAILED DESCRIPTION OF EXAMPLE EMBODIMENTS

Figure 1:
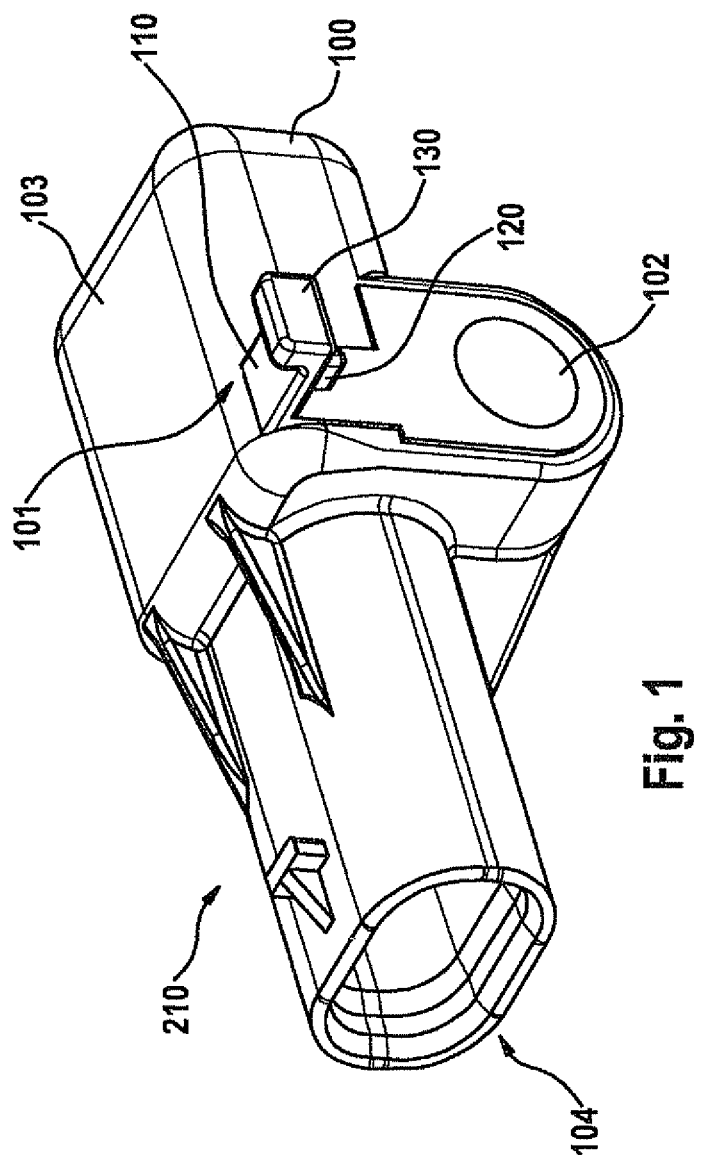
FIG. 1 shows a perspective view of a component carrier according to the present invention as per a first specific embodiment.

FIG. 1 shows a component carrier 100 according to the present invention for fastening an electrical component on a mounting surface. In the present case, component carrier 100 is designed as a module housing for an acceleration sensor of an airbag system in a motor vehicle. The acceleration sensor (not shown here) is situated in a receptacle area 103 of component carrier 100. Mounting module 210 thus formed is provided for installation on a mounting wall in the vehicle interior. The installation of mounting module 210 is preferably performed with the aid of simple installation arrangement, for example, a screw connection. For this purpose, component carrier 100 has a corresponding installation device 102, which is designed in the present case as a through hole to receive a screw. Furthermore, an electrical connection area 104 is provided, in order to electrically connect the acceleration sensor to corresponding components of the airbag system. Connection area 104 is typically designed as a contact socket. In order to allow one-handed installation of sensor module 210, pre-fixation of sensor module 210 on the mounting wall is provided. For this purpose, a special retaining device 101 is molded on component carrier 100, using which sensor module 210 is fixable in a corresponding through-opening of the mounting wall in a predefined installation position. Retaining device 101, which is situated in the present example above hole 102, includes a pin-shaped structure 110, a rib structure 120, which is situated underneath and extending along pin structure 110, and a securing structure 130, which is situated at the free end of pin structure 110 and extends generally perpendicularly to the insertion direction.

Retaining device 101 is preferably situated above the center of gravity of sensor module 210.

Figure 2:
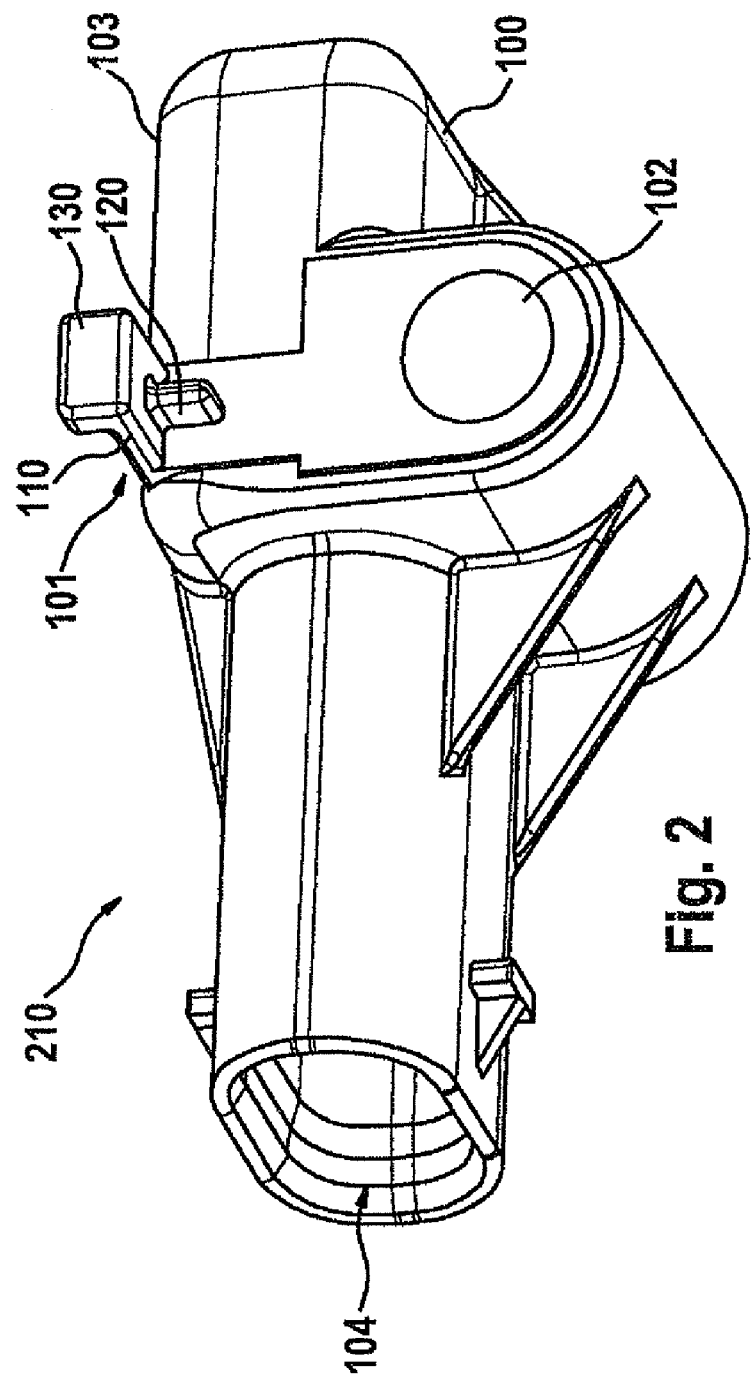
FIG. 2 shows the component carrier from FIG. 1 in a further perspective view.

FIG. 2 shows a sensor module 110 in a further perspective view. It is apparent in this case that rib structure 120 extending along pin structure 110 is set back in relation to lug-shaped securing structure 130. This is performed in order to allow insertion of retaining device 101 into a corresponding through-opening of the mounting wall using a tilting movement.

Figure 3:
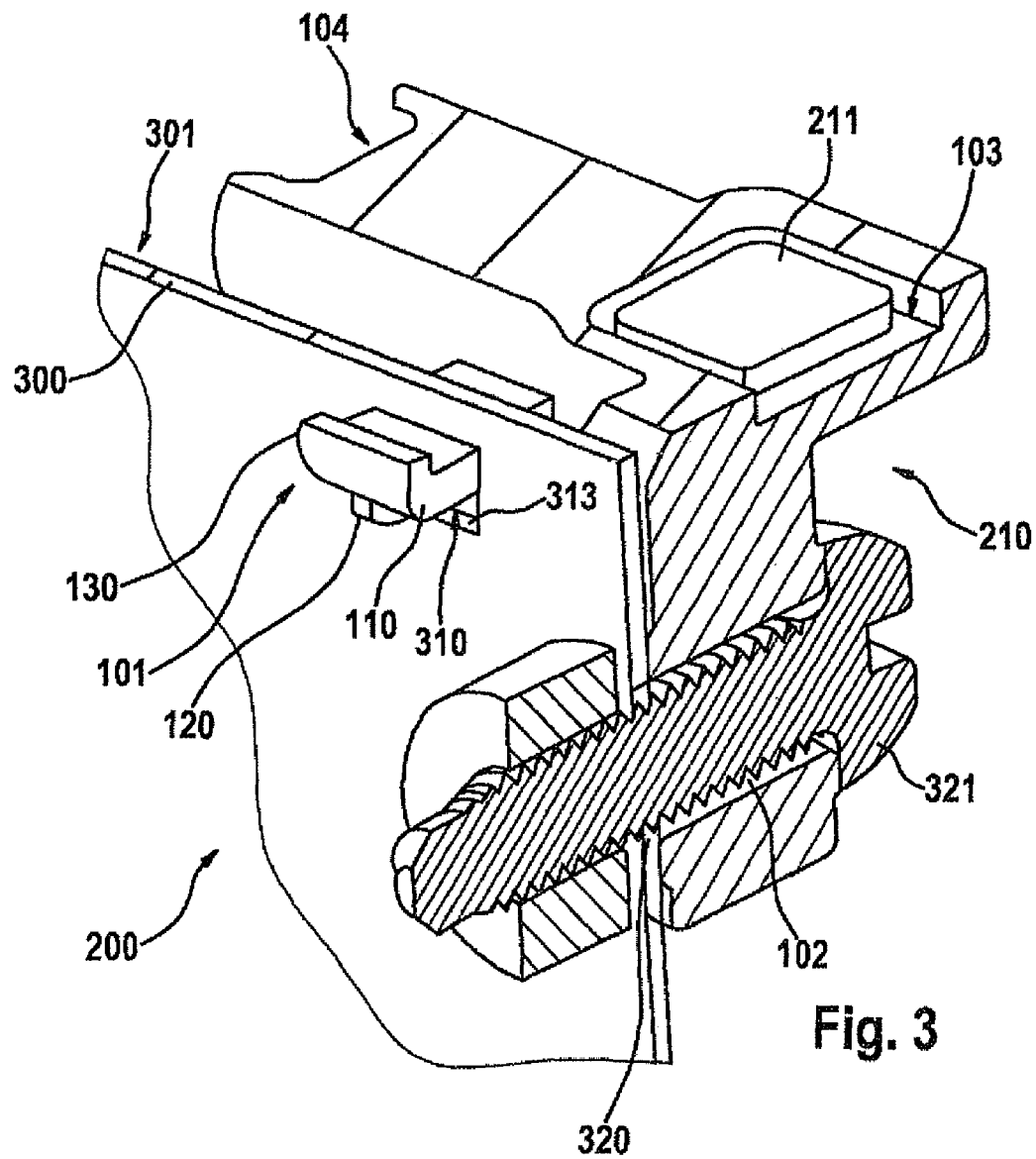
FIG. 3 shows an example of a perspective cross-sectional view of the fastening system according to the present invention having a component carrier installed on a mounting wall.

FIG. 3 shows a perspective cross-sectional view of a sensor module 210 according to the present invention in the installed state. Sensor module 210 is fastened on a mounting surface 301 of mounting wall 300. Retaining device 101 of component carrier 100 is inserted into a rectangular through-opening 310 formed in mounting wall 100. Furthermore, module 210 is fixedly connected to the mounting wall using a through hole 102 in the module body and a corresponding hole 320 in mounting wall 300.

Through-opening 310 is preferably implemented as a rectangular punch-out in the sheet metal plate forming mounting wall 300. Retaining device 101 is preferably designed in such a way that in the installation position shown here, it is held in a transition fitting between side walls 313 of through-opening 310.

The acceleration sensor forming actual component 211 is housed in a recess, which forms receptacle device 103, in the upper right area of component carrier 100. In fastening system 200 according to the present invention, retaining device 101 is used as a twist lock of sensor module 210 after screw connection 321 is established.

Figure 4:
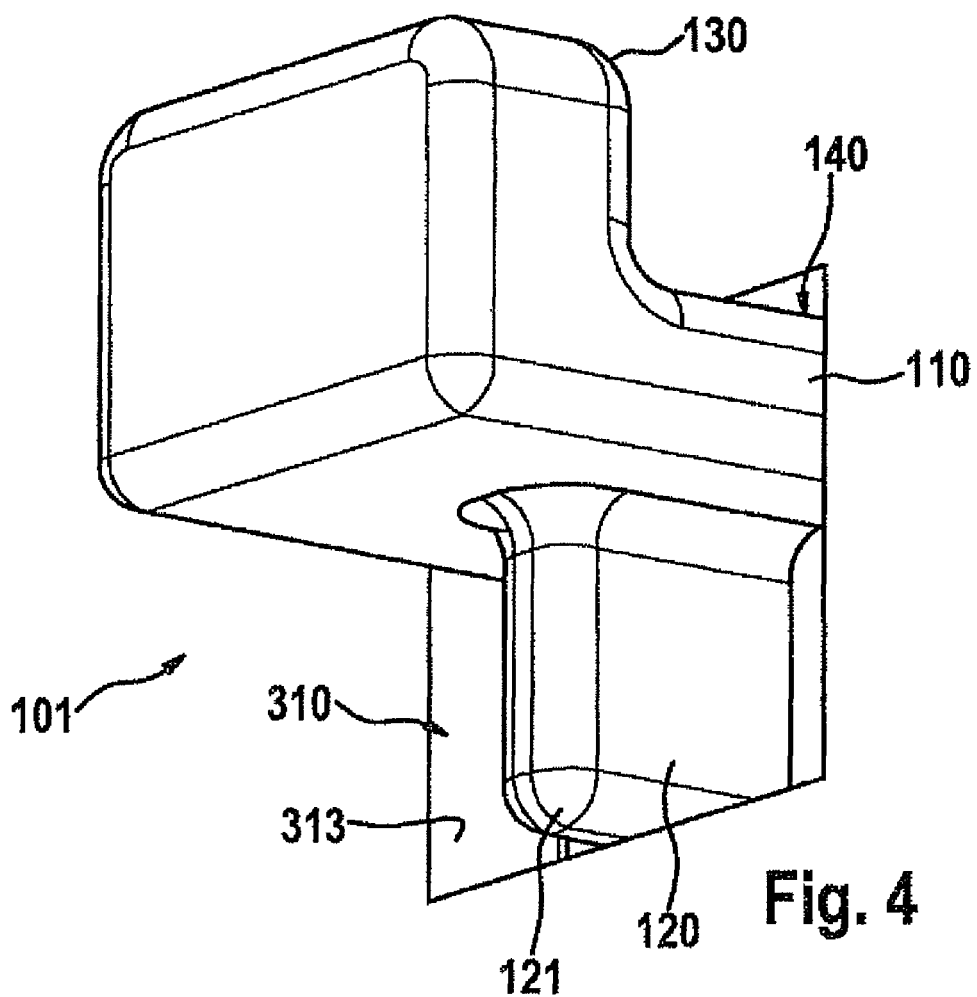
FIG. 4 shows the retaining device from FIGS. 1 and 2 fastened in a through-opening of a mounting wall.

FIG. 4 shows a detail view of retaining device 101 fixed in through-opening 310. The fixation is preferably performed with the aid of a transition fitting, the height of retaining device 101 in a fixation area 140 essentially corresponding to the dimensions of through-opening 310. Retaining device 101 is preferably supported on the upper side of the through-opening over the widest possible area, while the support of retaining device 101 in the lower area of the through-opening is only performed over the relatively narrow rib structure 120. In order to achieve a balanced force ratio, rib structure 120 is preferably situated centrally on pin structure 110. Depending on the application, however, the positioning of the rib structure in relation to the pin structure may vary. In particular an unambiguous installation coding according to the key-lock principle may be implemented by varying the position of rib structure 120. The width of the rib structure may also vary depending on the application.

Figure 5:
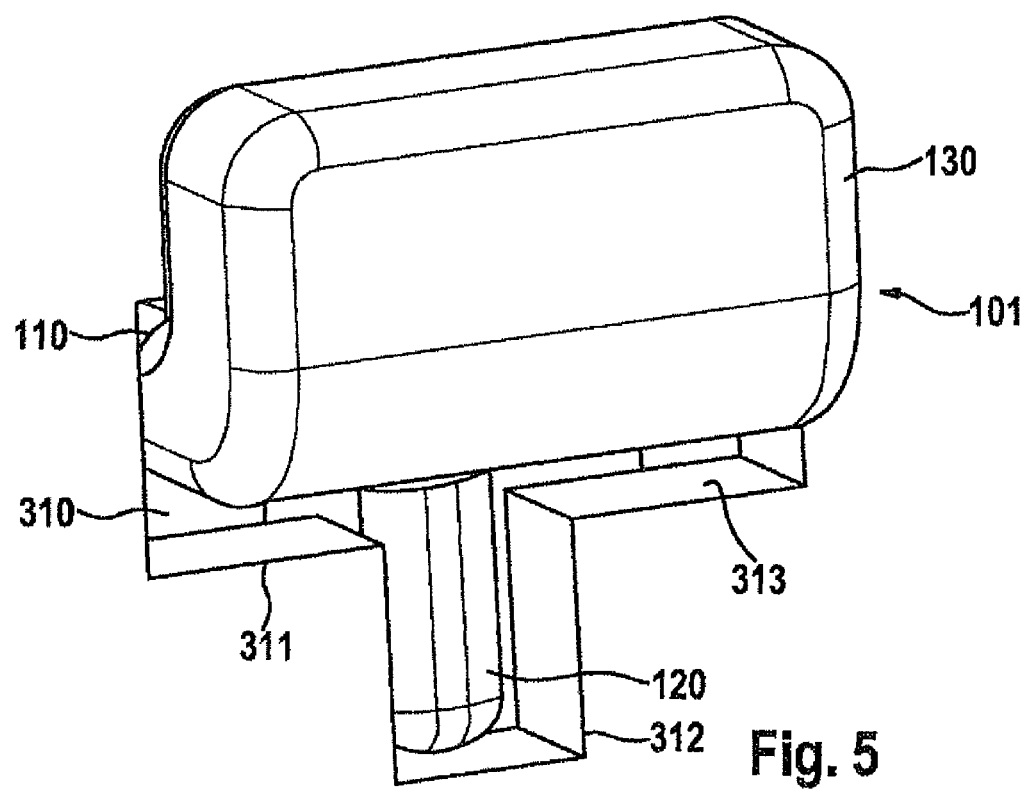
FIG. 5 shows a further perspective view of the retaining device from FIGS. 1 and 2.

FIG. 5 illustrates the principle of the installation coding, in which only one sensor module 210 is fixable in a through-opening 310 using a suitable retaining device 101. Retaining device 101 engages in a through-opening 310, which is formed from a generally rectangular main opening 311 for receiving pin structure 110 and a slotted opening 312 adjoining main opening 311 for receiving rib structure 120. The width of slotted opening 312 and its position along the lower edge of main opening 311 specify how rib structure 120 of matching retaining device 101 must be designed. Only a correspondingly designed rib structure 120 allows the insertion of retaining device 101 into through-opening 310. It may thus be ensured that a mounting module 20 is not incorrectly installed at a position not provided for this purpose.

Figure 6A:
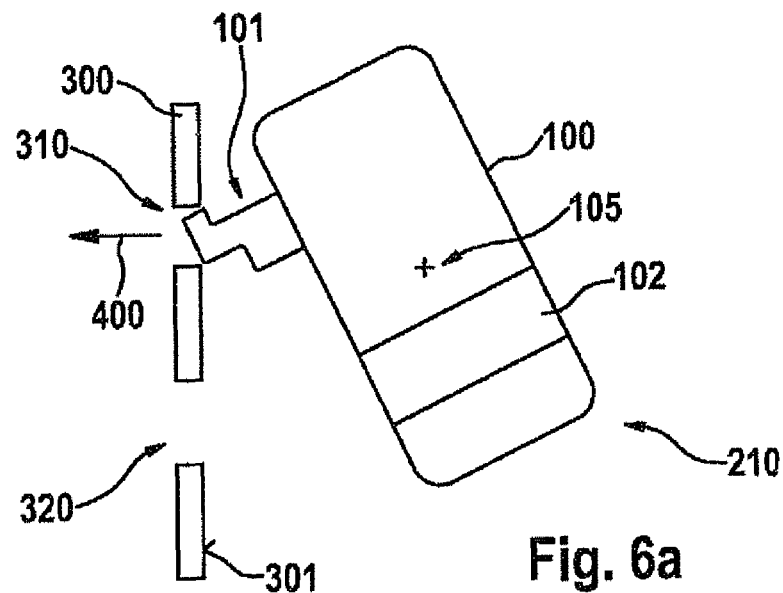
FIGS. 6a through 6d schematically show successive installation steps of the retaining device from FIG. 5.
Figure 6B:
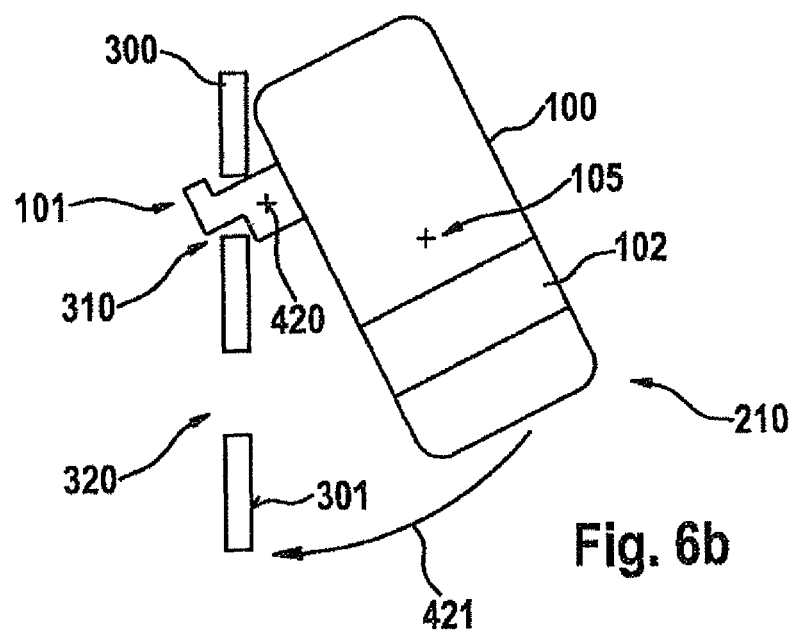
Figure 6C:
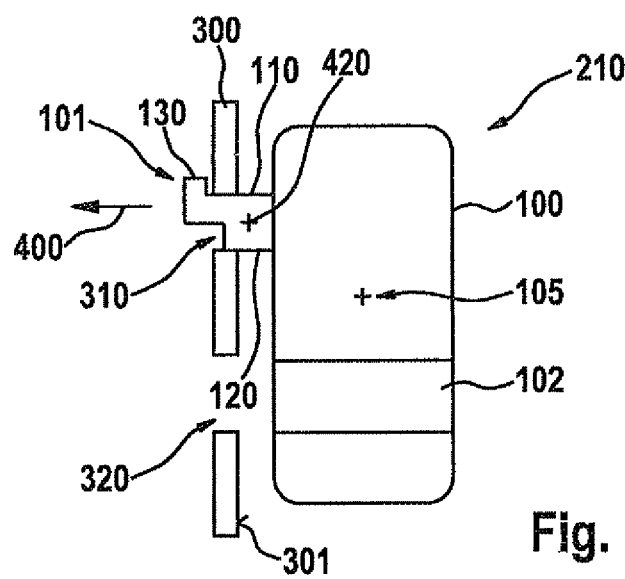
Figure 6D:
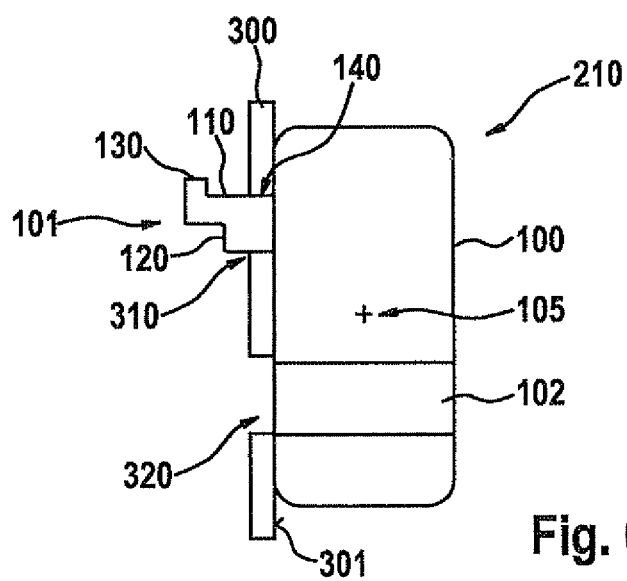

The pre-fixation of sensor module 210 from FIGS. 1 through 3 is explained in greater detail on the basis of multiple installation steps in the following FIGS. 6a through 6d. FIG. 6a shows sensor module 210 placed on mounting wall 300. In order to allow insertion of retaining device 101 into through-opening 310, sensor module 210 is tilted by a corresponding angle. Through a translational movement in an insertion direction 400, retaining device 101 is inserted sufficiently far into through-opening 310 so that securing structure 130 exits again at the other end of through-opening 310. The corresponding situation is shown in FIG. 6b. From this position, a rotational movement is now performed around a rotational axis 420 which is essentially perpendicular to the insertion direction. Through the rotation, which is indicated here using an arrow 421, rib structure 120 slides over the lower side wall of through-opening 310. In order to make this movement easier and prevent jamming of retaining device 101 in through-opening 310, the corresponding area of rib structure 120 may be rounded.

As indicated in FIG. 6b, center of gravity 105 of sensor module 210 and rotational axis 420 are located in relation to one another in such a way that the tilting movement of the sensor module during the insertion of retaining device 101 is performed generally supported by the intrinsic weight of the sensor module.

The rotational movement is continued until sensor module 210 reaches a predefined installation position. The surface of sensor module 210 facing toward mounting wall 300 is oriented generally parallel to mounting surface 301 of mounting wall 300, while retaining device 101 is inserted generally perpendicularly into through-opening 310. Furthermore, hole 102 is situated generally aligned with installation opening 320 in mounting wall 300. In this position, the intrinsic weight of sensor module 210 exerts a desired retention function and therefore effectively prevents retaining device 101 from falling out of through-opening 310.

Using a further translational movement in insertion direction 400, retaining device 101 may now be inserted further through through-opening 310 until the side of component carrier 100 facing toward mounting wall 300 presses against mounting wall 300. For this purpose, the vertical dimension of retaining device 101 is adapted to the dimension of through-opening 310 in such a way that insertion may be performed without great resistance but preferably with little play. This is preferably achieved by a corresponding transition fitting between participating structures 110, 120 of retaining device 101 and the side walls of through-opening 310.

Figure 7:
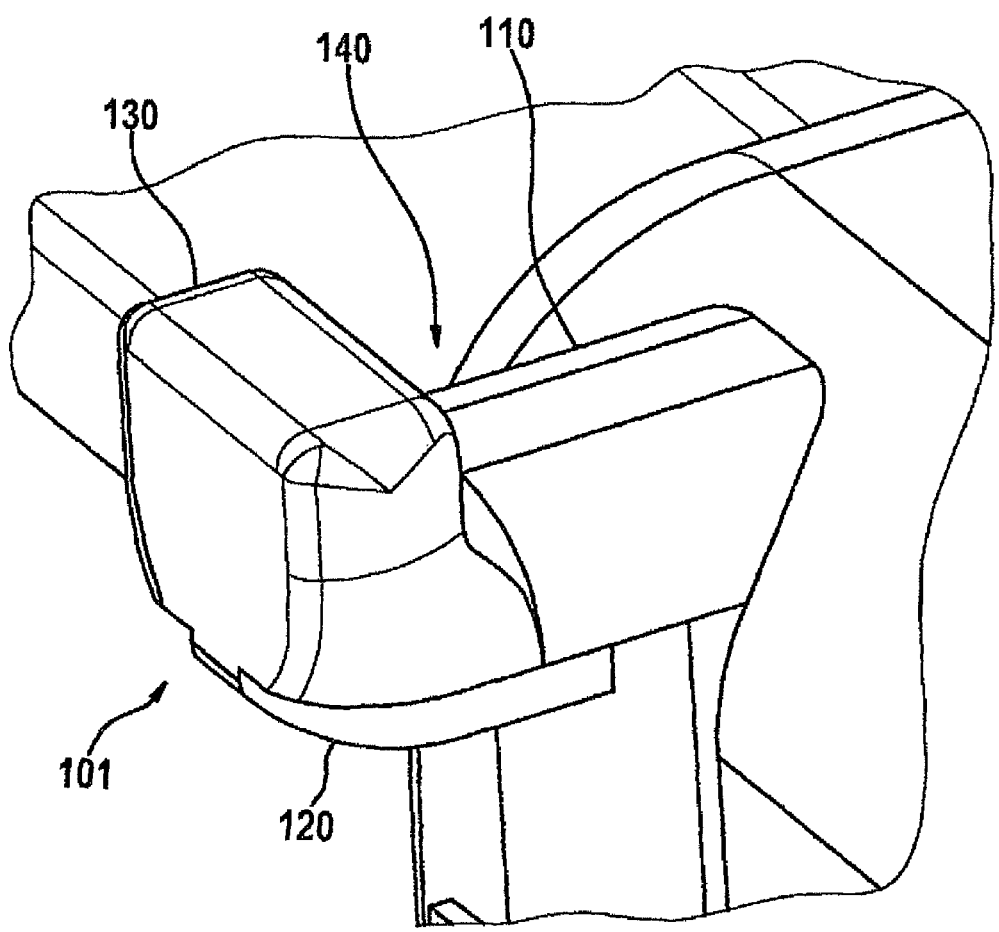
FIG. 7 shows a specific embodiment of the retaining device having a rounded profile.

A further specific embodiment of the pre-fixation of sensor module 210 on mounting wall 300 is explained hereafter. In contrast to the first examples previously explained, in this case the predefined installation position is not achieved by a rotation around a rotational axis perpendicular to the insertion direction, but rather around a rotational axis parallel thereto. FIG. 7 shows a modified variant of retaining device 101 for establishing a corresponding pre-fixation. The retaining device is also formed in this case from a pin-shaped structure 110, a rib structure 120 extending along pin structure 110, and an upwardly directed securing structure 130 situated on the free end of pin structure 110. In order to allow a rotation within through-opening 310, pin structure 110 preferably has a rounded profile. Rib structure 120 extends in the present example over the entire length of retaining device 101, but has a rounding 121 on its free end for easier insertion of the retaining device into corresponding through-opening 310.

Figure 8:
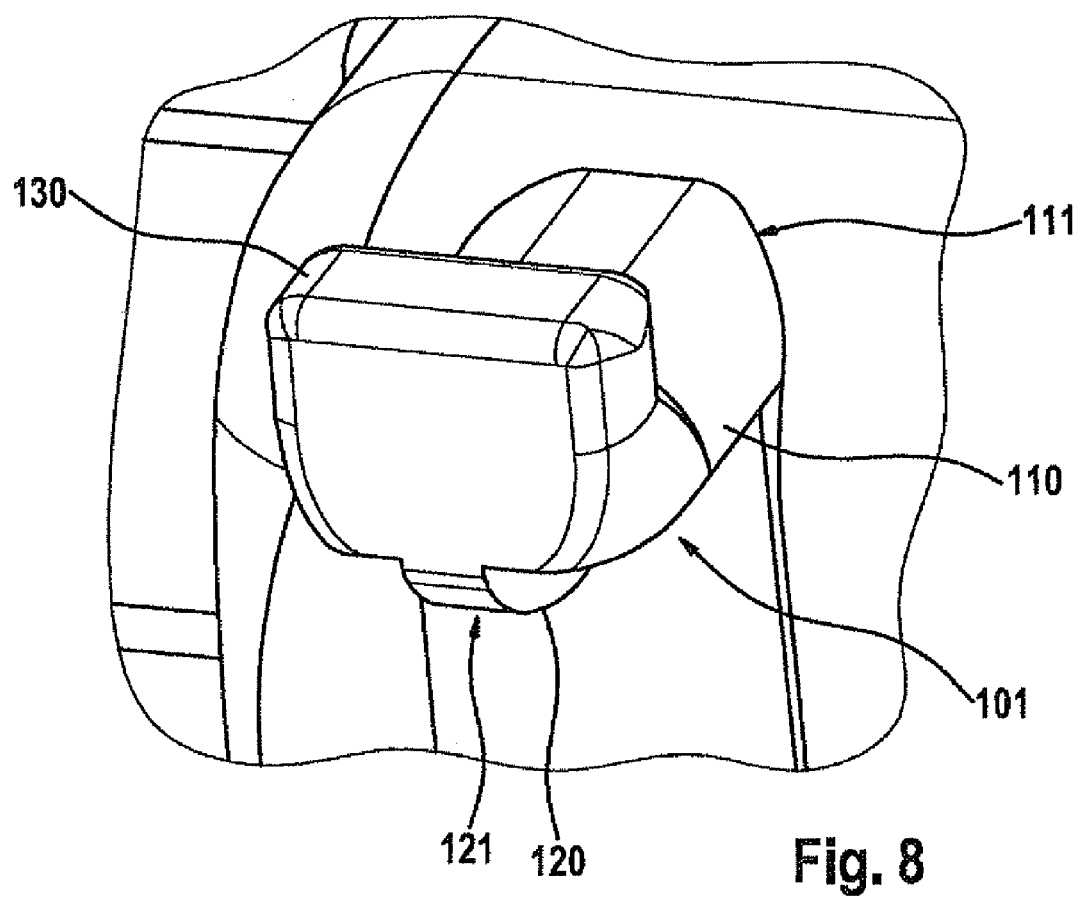
FIG. 8 shows a further perspective view of the retaining device from FIG. 7.

FIG. 8 shows a further perspective view of modified retaining device 101. The generally rounded profile of pin structure 110 is apparent here. Furthermore, rounding 121 of rib structure 120 is also apparent in this perspective.

Figure 9:
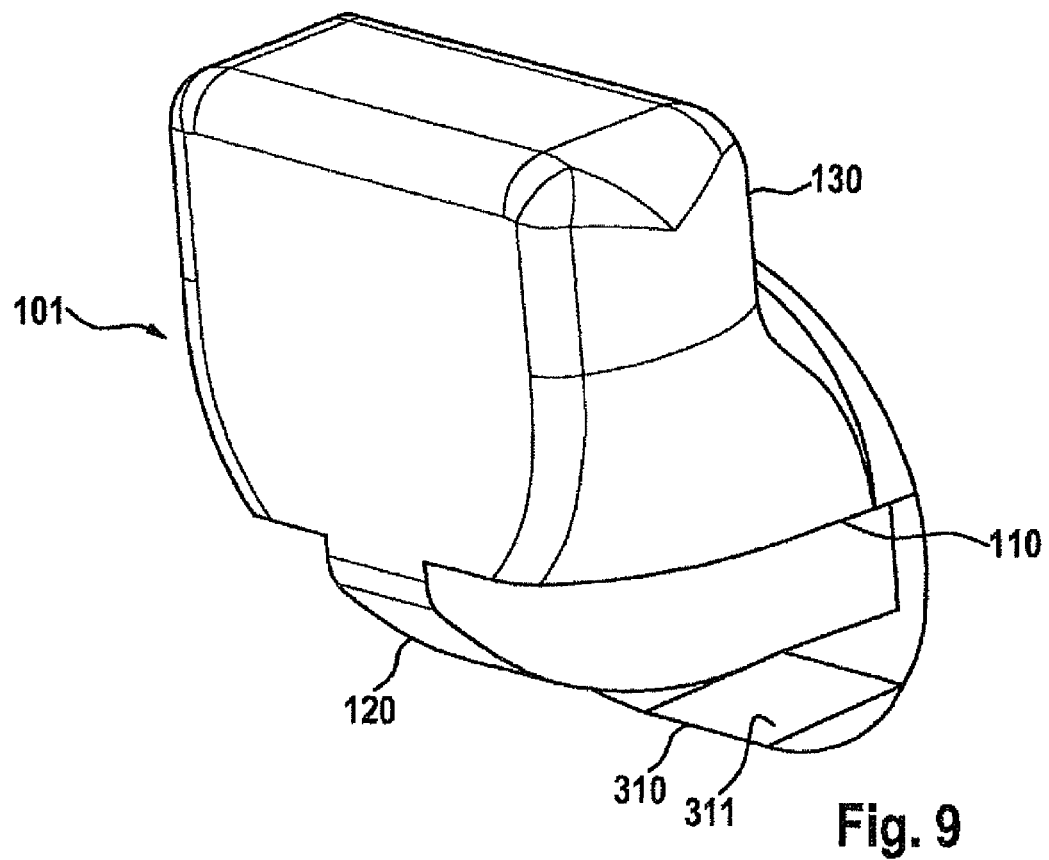
FIG. 9 shows the retaining device from FIG. 7 installed in a corresponding through-opening of a mounting wall.

FIG. 9 shows retaining device 101 from FIGS. 7 and 8 in the installed state. Retaining device 101 is preferably fixed with the aid of a transition fitting in through-opening 310. As is apparent from this figure, through-opening 310 has a rounded profile to allow a rotation of retaining device 101 situated therein.

Figure 10A:
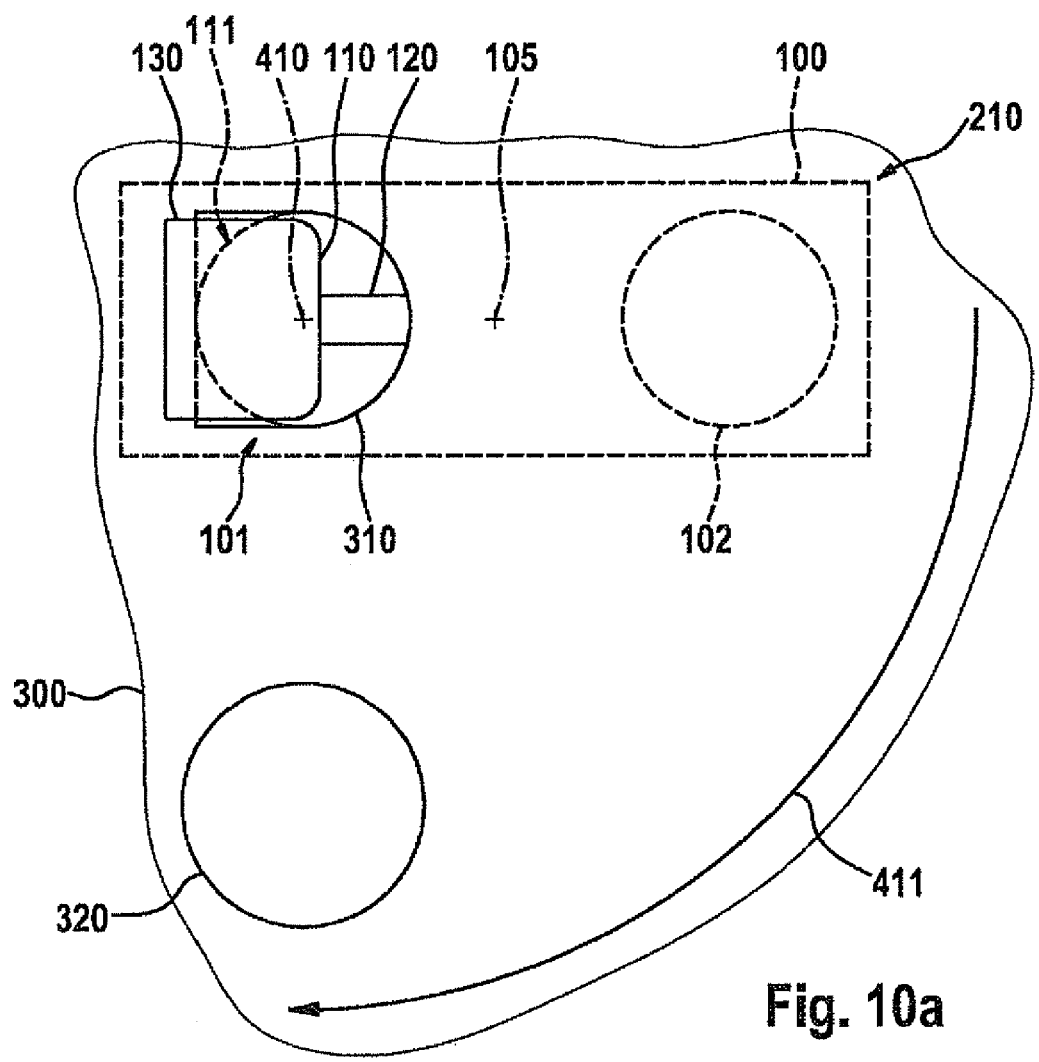
FIGS. 10a through 10c schematically show various successive installation steps of the retaining device from FIG. 8.
Figure 10B:
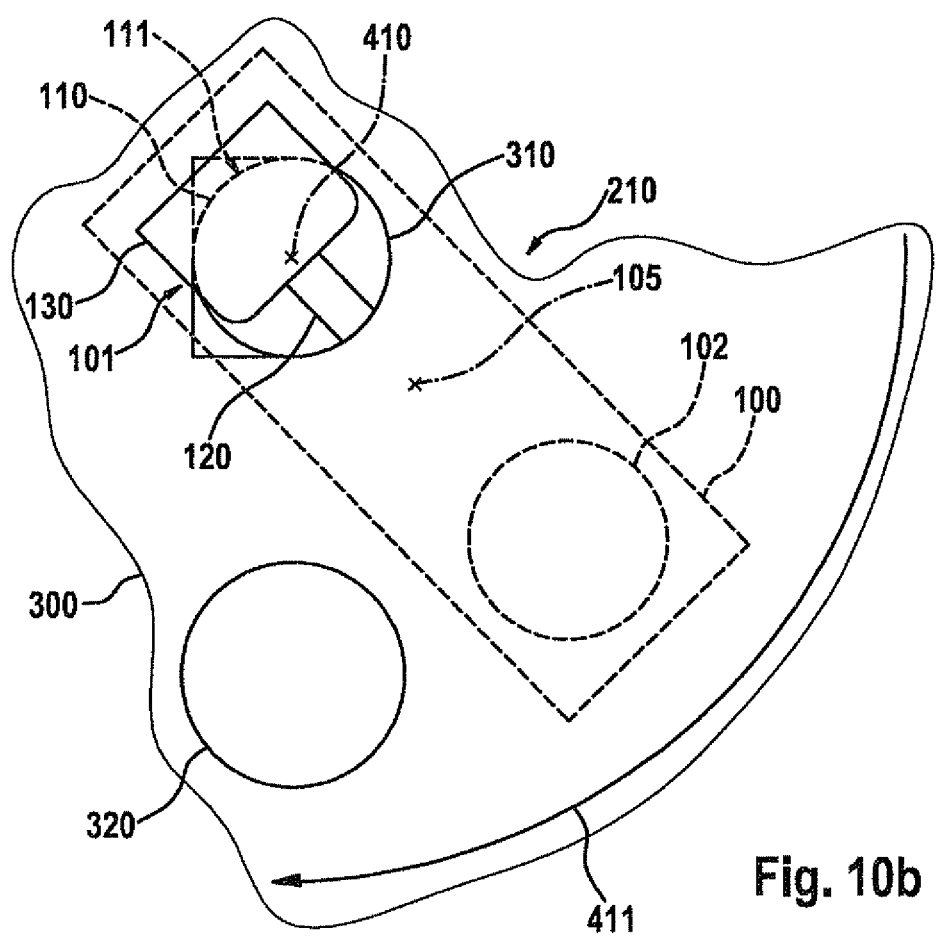
Figure 10C:
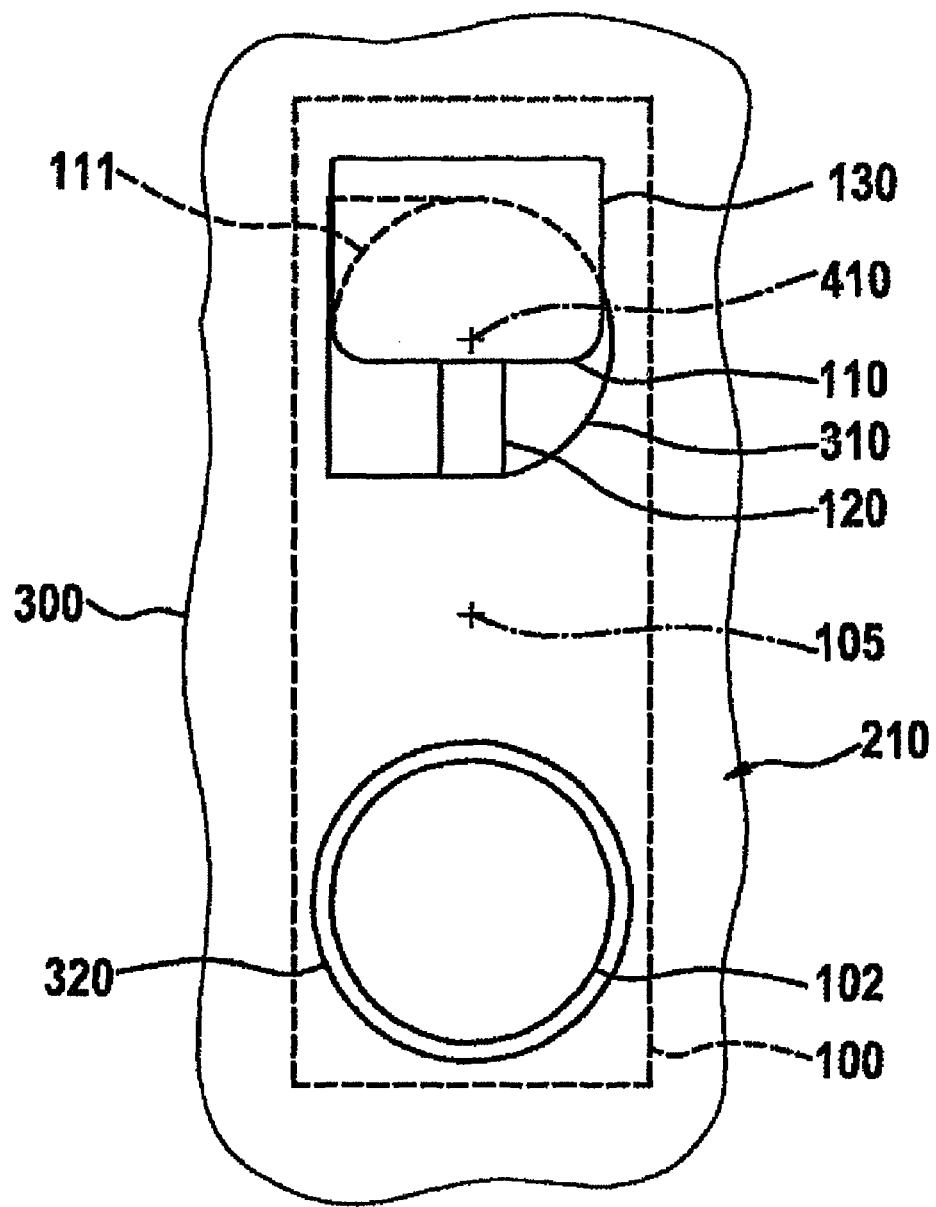

Following FIGS. 10a through 10c schematically show various steps for establishing the pre-fixation. FIG. 10a shows a sensor module 210 in a starting position, in which retaining device 101 is already inserted within D-shaped through-opening 310. The dashed line illustrates that sensor module 210 is located behind the mounting wall (not shown here) in this perspective. Only the parts of mounting module 210 inserted into through-opening 310 or protruding therethrough, namely rib structure 120, securing structure 130, and a part of pin structure 110, are visible. A part of through-opening 310 concealed by securing structure 130 is accordingly also shown by dashed lines. The dimensions of retaining device 101 and through-opening 310 were adapted to one another in such a way that retaining device 101 preferably presses against the side walls of through-opening 310 in multiple areas in a transition fitting. If securing structure 130 protrudes beyond through-opening 310, as in the present case, the insertion of retaining device 101 into through-opening 310 requires a combined translational and rotational movement. Rounding 121 of rib structure 120 is advantageous for this purpose.

The fixation of retaining device 101 within through-opening 310 is performed by a rotation, indicated here using an arrow 411, around a rotational axis 410 parallel to the insertion direction. The rotation of retaining device 101 within through-opening 310 is made possible by the profile, which is accordingly designed as round, in fixation area 410. Roundings 111 of pin structure 110 and the circular design of the right area of opening 310 make the rotational movement easier, since the retaining device is preferably guided with as little play as possible by the side walls of the through-opening. FIG. 10b shows mounting module 210 during the rotation within opening 310.

At the endpoint of the rotation, mounting module 210 has achieved an essentially perpendicular orientation. In this predefined installation position, hole 102 is situated essentially aligned with installation opening 320 of mounting wall 300. Due to center of gravity 105, which is situated below rotational axis 410, the achieved installation position forms a stable final location of the rotation. Through the adaptation of the cross-sectional profile in the fixation area of retaining device 101 to the contours of through-opening 310, the retaining device is preferably fixed without play in opening 310 with the aid of a transition fitting.

What is claimed is:

1. A component carrier for fastening a component on a mounting wall having a through-opening, comprising:
    a receptacle device for the component;
    an installation device for establishing a fixation of the component carrier on the mounting wall; and
    a retaining device for pre-fixation of the component carrier in the through-opening, the retaining device including a pin structure and a rib structure extending along the pin structure, the pin structure and rib structure forming a fixation area using which the retaining device is fixable in the through-opening, and wherein the retaining device further includes a securing structure, which is situated on a free end of the pin structure opposite to the rib structure, against pulling of the retaining device out of the through-opening.

2. The component carrier as recited in claim 1, wherein the retaining device is situated above a center of gravity of the component carrier.

3. The component carrier as recited in claim 1, wherein a diameter predefined by the pin structure and the rib structure in the fixation area being selected in such a way that the retaining device is fixable in the through-opening with the aid of a transition fitting.

4. The component carrier as recited in claim 1, wherein the securing structure is a lug extending perpendicularly to an insertion direction.

5. The component carrier as recited in claim 1, wherein the installation device is a hole for receiving a fastener.

6. The component carrier as recited in claim 1, wherein the rib structure has a rounding on a free end.

7. The component carrier as recited in claim 1, wherein the rib structure is a safeguard against incorrect installation of the retaining device in a through-opening having a slotted expansion, a position of the rib structure along a circumference of the pin structure being selected in accordance with a position of a slotted expansion along the circumference of the through-opening.

8. The component carrier as recited in claim 1, wherein the rib structure is set back in relation to the securing structure along the pin structure.

9. The component carrier as recited in claim 1, wherein a profile of the pin structure in the fixation area has a rounding, which allows a rotational movement of the retaining device located in the through-opening around an axis oriented in an insertion direction.

10. A mounting module including a component carrier for fastening a component on a mounting wall having a through-opening, comprising:
    a receptacle device for the component;
    an installation device for establishing a fixation of the component carrier on the mounting wall; and
    a retaining device for pre-fixation of the component carrier in the through-opening, the retaining device including a pin structure and a rib structure extending along the pin structure, the pin structure and rib structure forming a fixation area using which the retaining device is fixable in the through-opening, and wherein the retaining device further includes a securing structure, which is situated on a free end of the pin structure opposite to the rib structure, against pulling of the retaining device out of the through-opening; and
    a component situated in the receptacle device, wherein the component is an acceleration sensor.

11. A fastening system including a component carrier for fastening a component on a mounting wall having a through-opening, comprising:
    a receptacle device for the component;
    an installation device for establishing a fixation of the component carrier on the mounting wall; and
    a retaining device for pre-fixation of the component carrier in the through-opening, the retaining device including a pin structure and a rib structure extending along the pin structure, the pin structure and rib structure forming a fixation area using which the retaining device is fixable in the through-opening, and wherein the retaining device further includes a securing structure, which is situated on a free end of the pin structure opposite to the rib structure, against pulling of the retaining device out of the through-opening;
    wherein the component carrier is pre-fixed with the aid of the retaining device on the mounting wall.

12. The fastening system as recited in claim 11, wherein the retaining device is designed to retain the component carrier in a predefined installation position because of its own weight.

13. The fastening system as recited in claim 12, wherein the predefined installation position results from a rotational movement of the retaining device within the through-opening.

* * * * *